(12) United States Patent
Catiller

(10) Patent No.: US 7,031,902 B1
(45) Date of Patent: Apr. 18, 2006

(54) PRESILICON DISK MODEL FOR DESIGN, DEVELOPMENT AND VALIDATION

(75) Inventor: Robert D. Catiller, Mission Viejo, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 796 days.

(21) Appl. No.: 10/087,550

(22) Filed: Feb. 28, 2002

(51) Int. Cl.
*G06F 9/455* (2006.01)
(52) U.S. Cl. .......................................... 703/24; 703/25
(58) Field of Classification Search ................... 703/24, 703/7, 6
See application file for complete search history.

(56) References Cited

U.S. PATENT DOCUMENTS

| | | | |
|---|---|---|---|
| 4,929,889 A | 5/1990 | Seiler et al. | |
| 5,291,584 A * | 3/1994 | Challa et al. | 703/24 |
| 5,371,748 A | 12/1994 | Saw et al. | |
| 5,404,492 A * | 4/1995 | Moraru et al. | 703/13 |
| 5,867,505 A | 2/1999 | Beffa | |
| 5,953,516 A * | 9/1999 | Bonola | 703/24 |
| 6,135,648 A * | 10/2000 | Stefek et al. | 703/13 |
| 6,240,543 B1 | 5/2001 | Bhandari | |

OTHER PUBLICATIONS

IBM Technical Disclosure Bulletin NN880179, Diskette and Hardfile Electronic Drive Simulator, Jan. 1988.*
Cha, E.; Bogy, D.B.; "Numerical simulation and animation of Head-Disk-Assembly dynamics", Nov. 1991, IEEE Transactions on Magnetics, vol. 27, Issue 6, Part 2.*
Ray Turner, Slashing Time-To-Market—Part 1, Electronic News, May 14, 2001, p. 27.

* cited by examiner

*Primary Examiner*—Paul L. Rodriguez
*Assistant Examiner*—Russ Guill
(74) *Attorney, Agent, or Firm*—Jason T. Evans, Esq.; Young Law Firm

(57) ABSTRACT

A method for verifying the design of a disk controller circuit to be incorporated into a targeted hard disk drive system having a read/write channel and a head actuator may include steps of emulating reading and writing of data in the read/write channel based upon a model of the read/write channel, emulating a behavior of the head actuator during track seek and track following operations based upon an electromechanical model of the head actuator, providing a disk controller design base for defining integrated circuit elements comprising the disk controller circuit and providing a controller environment to support execution and debug of firmware for operating the disk controller circuit. A plurality of disk functions may be carried out at a time-scaled rate according to a script. The plurality of disk functions includes interaction of at least the read/write model, the electromechanical model, the disk controller design base and the controller environment.

3 Claims, 4 Drawing Sheets

PRESILICON DISK MODEL FOR DESIGN, DEVELOPMENT AND VALIDATION

BACKGROUND OF THE INVENTION

1. Field of the Invention

The present invention relates to disk drives. More particularly, the present invention relates to a presilicon disk model of a disk drive for design, development and validation purposes and methods for validating the design of a disk controller circuit to be incorporated into a targeted hard disk drive system.

2. Description of the Prior Art

Time to market considerations and the fiercely competitive nature of the disk drive industry have led to increased pressures to accelerate the development of each subsequent generation of hard drives. Designing, prototyping and validating a new product, however, is time consuming and costly. The storage industry, therefore, has been seeking for methods of more efficiently bringing new products to market. Simulations provide a relatively inexpensive method of developing, testing and validating new disk drives. Simulation is the process of using software and/or programmable hardware to model electronic systems. Because it is expensive and time consuming to build silicon devices, simulation is used extensively before fabrication to verify that devices will work properly. Previous models and simulations, however, only modeled a few selected functions of the hard drive, and did not do so with the same timing as a real hard drive and did so only with extensively modified firmware.

However, unless all of the major components of a hard drive are modeled and emulated (with the correct timing), the usefulness of the pre-silicon testing and validation diminishes, as extensive modifications to the drive's firmware must be carried out to account for the less than complete and/or accurate simulation. In turn, as the simulation's firmware does not correspond to the firmware to be ultimately incorporated in the real drive, additional extensive testing must be carried out on the physical drive to validate the underlying design. What are needed, therefore, are methods and systems for simulating entire drives while maintaining the accurate timing of the operation of the various components thereof. Such methods and systems would enable the design, testing and validation of entire disk drives using the same (or only minimally-modified) firmware as will be incorporated in the resulting physical disk drive.

SUMMARY OF THE INVENTION

Accordingly, this invention may be regarded as a method for verifying the design of a disk controller circuit to be incorporated into a targeted hard disk drive system, wherein the targeted hard disk drive system comprises a read/write channel and a head actuator. The method includes the steps of emulating reading and writing of data in the read/write channel based upon a model of the read/write channel; emulating a behavior of the head actuator during track seek and track following operations based upon an electromechanical model of the head actuator; providing a disk controller design base for defining integrated circuit elements comprising the disk controller circuit; providing a controller environment to support execution and debug of firmware for operating the disk controller circuit and performing a plurality of disk functions according to a script, wherein the plurality of disk functions comprise interaction of the read/write model, the electromechanical model, the disk controller design base and the controller environment.

The plurality of disk functions may be performed at a time-scaled rate and the time-scaled rate maintaining an accurate relative time relationship between the disk functions performed under direction of the script, and a real-time performance of the disk functions. The disk functions may be performed at a plurality of environmental and/or process limits and the models and the design base may be made to operate according to their predicted behavior at the environmental or process limits.

The foregoing and other features of the invention are described in detail below and set forth in the appended claims.

DESCRIPTION OF THE PREFERRED EMBODIMENTS

A method of emulating a new disk drive design in software as well as programmable hardware includes the use of, for example, Complex Programmable Logic Devices ("CPLDs") such as Field programmable Gate Arrays (hereafter, "FPGAs") that are programmed to emulate one or more components of a magnetic hard disk drive. Design emulation can help to reduce time to market and save turns of silicon. Indeed, design emulation can accelerate product development in advance of a stable platform and can improve product quality by testing earlier and longer in the product cycle.

Figure 1A:
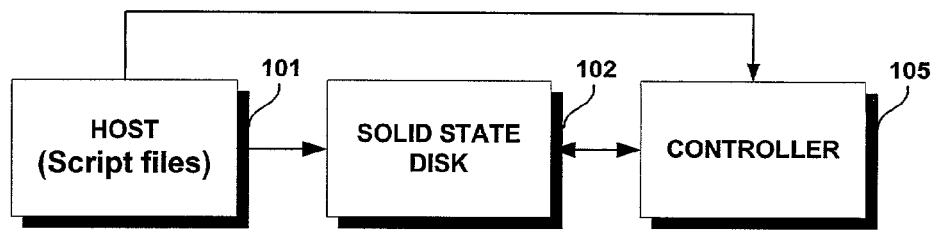
FIG. 1A is a high-level block diagram of a presilicon disk model, according to an embodiment of the present invention.

FIG. 1A is a high-level diagram of a presilicon disk model, according to an embodiment of the present invention. As shown therein, the present disk model 100 includes a solid-state disk 102 and a controller 105. The present solid-state disk 102 may be coupled to a host 101 (such as a personal computer, for example) via a host bus connector (not shown) for the transfer of commands, status and data. The host 101 may issue read and/or write commands, as dictated by the execution of a software script for performing disk functions. The solid-state disk 102 is coupled to a model of a controller 105 according to the present invention, also coupled to the host 101.

Figure 1B:
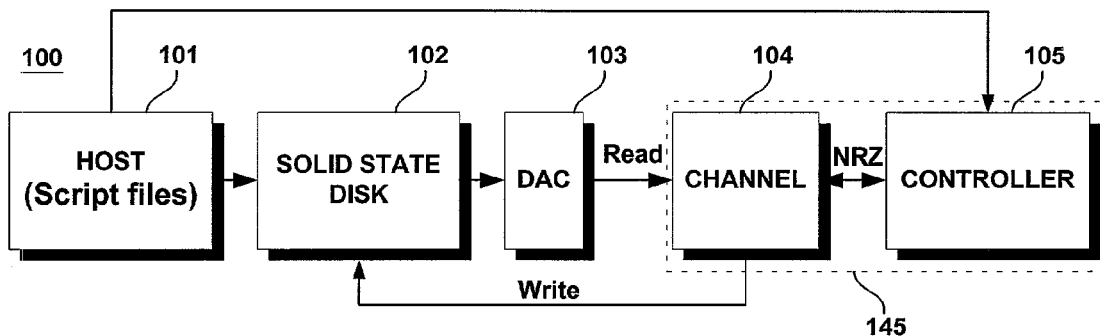
FIG. 1B is a diagram of a presilicon disk model, according to another embodiment of the present invention.

FIG. 1B is a diagram of the presilicon disk model 100 of the present invention, according to another embodiment thereof. As shown therein, the solid-state disk 102 may be coupled to the controller 105 through a digital to analog controller (hereafter, "DAC") 103 that provides analog read data to a read/write channel model 104 that is coupled to the controller 105 via an Non Return to Zero (NRZ) interface, for example. The emulated channel 104 may, for example, employ partial response maximum likelihood ("PRML") coding techniques, although the present invention may be practiced with equal advantage using other coding techniques. As suggested by the dashed line of reference 145, the channel 104 and the controller 105 may be embedded in a single integrated circuit. The host interface and disk controller (hereafter, "HIDC") model 105 according to the present invention provides formatting, error detection and correction of disk data, responds to commands from the host 101 and stores data that is transferred between the solid-state disk 102 and the host 101. The channel 104 is also coupled to the solid-state disk 102 to provide the solid-state disk 102 with digital write commands.

Figure 2:
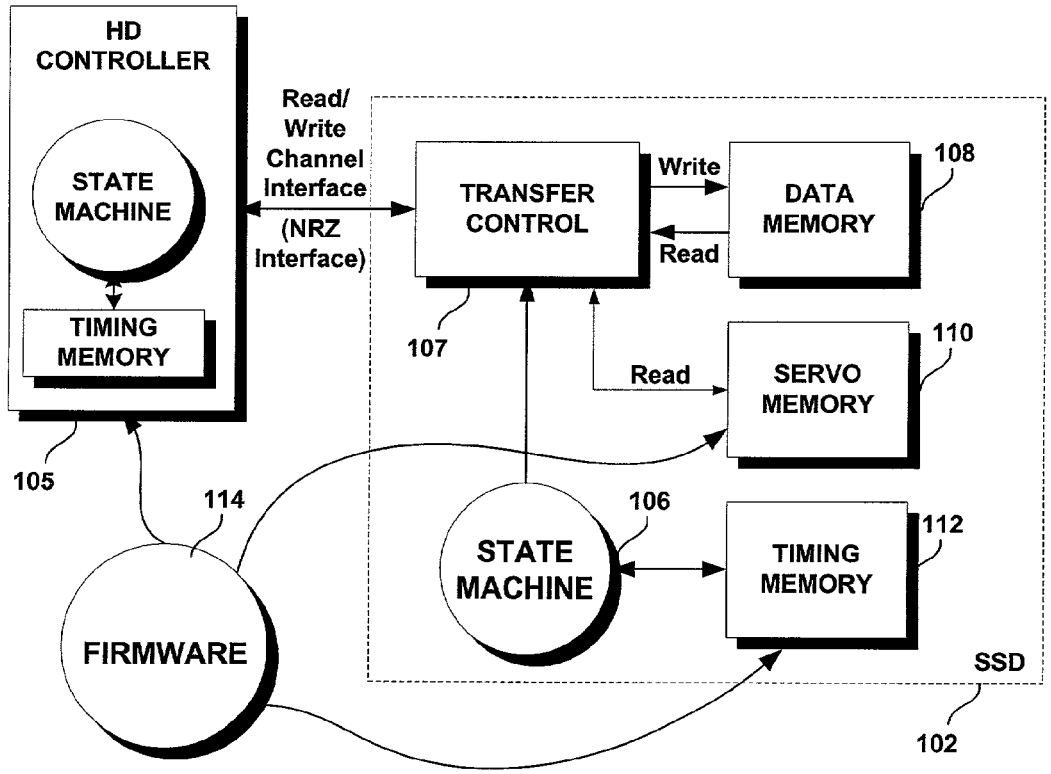
FIG. 2 is a data diagram of a solid-state disk, according to an embodiment of the present invention.

FIG. 2 is a data diagram of a solid-state disk 102, according to an embodiment of the present invention. The solid-state disk 102 is most useful when it enables the emulation of the exact timing of a real disk drive. Indeed, it is important that the emulation of the reading and writing of data to the solid-state disk 102 occurs at the same timing as such drive functions would in a real drive. This enables accurate testing of the firmware 114 (which is preferably the same firmware as a real drive or the same firmware that is to be incorporated in the resultant real drive) and other controller features that are dependent upon such timing. Toward that end, the solid-state disk 102 includes a data memory 108 for storing data, a servo memory 110 for storing servo wedge data, a timing memory 112 for storing timing data, a state machine 106 and a transfer control 107. The transfer control 107 interfaces with the HIDC controller 105 through a read/write channel interface. The HIDC controller 105 is controlled by firmware 114, which is also coupled to the servo memory 110 and to the timing memory 112. A state machine 106 controls the access by the transfer control 107 to the timing memory 112. Together, the solid-state disk 102, the host 101 (including the script files running thereon), the firmware 114 and the electromechanical model 302 (described relative to FIG. 3) provide a controller environment to support execution and debug of the firmware 114 for operating the disk controller 105, as described in detail below.

To enable the solid-state disk 102 to emulate a variety of disks, data formatting, spindle motor speeds and other disk and/or drive characteristics, the data memory 108, the servo memory 110 and the timing memory 112 are preferably separate and distinct memories. Alternatively, the memories 108, 110 and/or 112 may be embodied as independently loadable areas of a single memory device. In this manner, the data memory 108 stores only the data to be written to and read from the solid-state disk 102. The data memory 108, preferably does not store any sector, zone or timing information, but only the raw data written to or read from the disk 102. The data stored in the data memory 108 is preferably raw, frequency insensitive data. The data memory 108 may be or may include Dynamic Random Access Memory (hereafter, "DRAM"), such as a dual port Synchronous DRAM (hereafter, "SDRAM"), which is orders of magnitude faster than a real magnetic disk drive. The solid-state disk 102 may include, for example, 512 Mbytes of SDRAM storage for storing disk data that may be accessed during modeling operations. Fast accesses to timing and servo data stored in SDRAM (or in RAM including some other technology) enable time scaling the operation of the solid-state disk 102 faster than real time. Moreover, the disk functions emulated on the solid-state disk 102 may be performed at a plurality of environmental and/or process limits. This enables the designer to ascertain the drive's most error prone areas and to predict where the resulting real magnetic hard drive might fail. The models of the solid-state disk 102, the controller 105, the spindle motor model 316 and the VCM head model 306 may be configured to operate according to their predicted behavior at the environmental and/or process limits. In turn, this enables the drive design and validation team to selectively stress the controller 105, channel 104 and/or solid-state disk 102 faster than a real drive to spot failures.

The data memory 108 should be sufficient large to test the writing and reading of large blocks of data without the need to repeatedly re-write the same tracks to write large blocks of data to the disk 102. However, the data memory 108 need not be as large as would be necessary to store a number of tracks equal to those present on an actual spinning disk. Indeed, a very large memory would be needed to store a clock-by-clock image of each track of a real disk drive. Moreover, the drive firmware would then have to be modified to accommodate such a clock-by-clock image of each track. Instead, a limited and selectable number of unique tracks may be provided such as, for example, 250 unique and individual tracks. These tracks may be mapped to (through appropriate accesses to the servo memory 110 and the timing memory 112) and look like any track on any zone of a real spinning disk of a magnetic disk drive. In addition, one or more default tracks may be provided, thereby enabling the HIDC 105 to emulate seeking to and following any track, to allow the VCM and head actuator model 306 to emulate the behavior of a real disk drive. When the reading and writing commands issued by the HIDC controller 105 have written or read from all 250 tracks, the default track(s) may be configured (through appropriate accesses to the servo memory 110 and the timing memory 112) to resemble any track at any zone frequency of an actual spinning disk.

Figure 3:
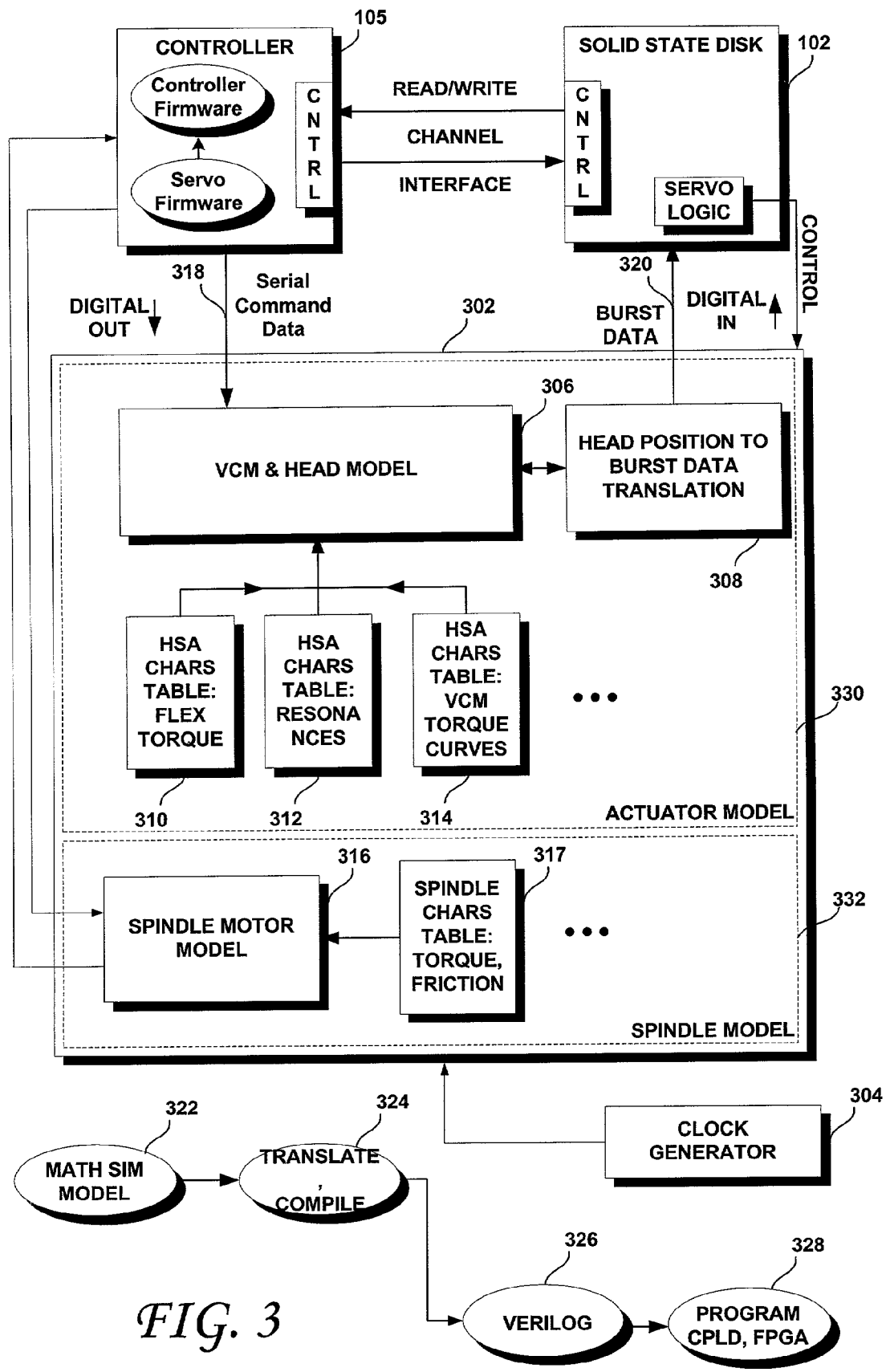
FIG. 3 is a diagram of an electromechanical model of a head actuator assembly coupled to the present solid-state disk and a model of the disk controller, according to an embodiment of the present invention.

The servo wedge data may be stored as servo wedge data tables in the servo memory 110 and the timing data may be stored as timing data tables in the timing memory 112. These tables may be generated using a standard spreadsheet computer program (running on the host 101, for example) and loaded within the memories 110, 112. The servo wedge data tables may include data drawn to the track ID, wedge number, servo sync word and the head number, for example. The timing memory 112 may store these values as Hard Sector Descriptor Tables (HSDT)—or an equivalent structure—for different track formats. The burst data may be externally generated, as shown in FIG. 3, for example. The timing data tables are scanned by the HIDC controller 105 and tell the controller 105 where the transfers of the raw data stored in the memory 108 occur around the servo wedges stored in the memory 112. This is necessary to emulate a real disk in which the sectors are frequently split across servo wedges. The timing tables in the timing memory 112 and the servo wedge data stored in the servo memory 110, in effect, are configured to enable the HIDC controller 105, through firmware 114, to apply the raw data stored in the data memory 108 to a variety of frequencies, depending upon the disk format that is being emulated and upon the sector and track of the data accessed by the HIDC 105. Changing the format of the emulated disk, therefore, becomes a simple matter of re-loading the timing data tables and servo data tables stored in the timing memory 112 and the servo memory 110, respectively. The mapping of each of the unique tracks to unique and selected cylinders may be readily changed by swapping in new timing tables into the timing memory 112.

To enable the HIDC controller 105 to be fully tested across different timings and potential error conditions, the present invention provides for timing windows having selectively variable boundaries. Such timing windows may be selectively opened and selectively closed (i.e., the width of the timing windows is selectable) around the expected timing of events such as the detection of sync marks and/or other data structures on the solid state disk 102. Indeed, to full, test the controller 105, it is useful to have the ability to move such timing windows around an expected timing of the corresponding signal and to monitor the resultant performance and behavior of the controller 105 and the drive firmware 114. For example, the timing boundaries for such signals as Sgate (Seek gate signal), Wgate (Write gate signal) and Rgate (Read gate signal) may be varied at will for exhaustive timing boundary testing of the controller 105.

Figure 4:
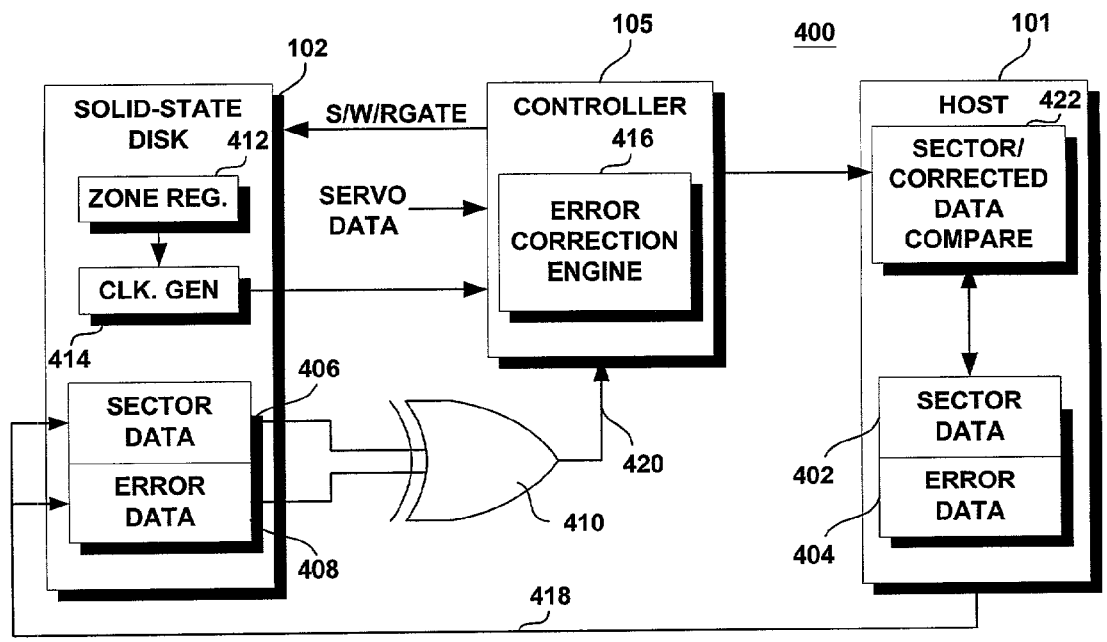
FIG. 4 is a block diagram of an error injection and detection mechanism, to an embodiment of the present invention.

The servo memory 110 and the timing memory 112 enable a high degree of control over the error injection process that is not possible using a real drive. For example, to test the firmware 114, the values stored in the servo memory 110 may be manipulated by changing a selected number of servo wedges to include incorrect track identifiers. The firmware 114 may then be observed to ascertain its behavior when it encounters such errors. Other errors may be injected, such as incorrect wedge numbers, for example. FIG. 4 is a block diagram of an error injection and correction mechanism, according to an embodiment of the present invention. According to the present invention and as shown therein, a software script may be stored on and executed by the host 101 to corrupt selected bytes of sector track data (among other error injection possibilities). For example, bytes 102, 305 and 503 of a sector track stored in sector data memory 402 may be corrupted in the host 101 by changing the bit values of these bytes to 1 (all other bytes being zero) and stored in the host in error data memory 404. The sector track data 402 may then be transported across the bus 418 and copied in the solid-state disk 102 at corresponding sector and error data memories 406 and 408, respectively. The bus 418 is preferably sufficiently wide to incorporate adjacent original track data and error track data. The stores 402, 404, 406 and 408 advantageously include SDRAM and the bus 418 may be an SDRAM bus.

Data streams from the sector data 406 and the error data 408 of the solid-state disk 402 may then be passed through an XOR gate 410. The logical XORing of these two data streams causes, in the current example, bytes 102, 315 and 503 of the track data to be corrupted (logical 1's become logical 0's and vice-versa) on the Non Return to Zero (hereafter, "NRZ") bus 420. In effect, the original track data may be corrupted, in real time, in a controllable and predictable manner and programmable errors may be injected into the solid-state disk 102, in real time or in a time-scaled (faster or slower than real time) manner. The NRZ corrupted data on the NRZ bus 420 may then passed through an error correction engine 416 within the controller 105 to correct the corrupted NRZ sector data. The resulting corrected data stream output from the error correction engine 416 of the controller 105 is compared, in the host 101 at 422, to the original sector data stored at 402 in the host 101, to detect any errors in the corrected data. The performance of the error correction engine 416 may be tallied within the host 101 by a counter (not shown). According to an embodiment of the present invention, each sector data track within the solid-state disk 102 is associated with an sector error track, making it possible to freely inject and detect a variety of errors in any of the data tracks of the solid-state disk 102 and to test the controller's error correction engine 416 under a variety of error conditions. The error injection and detection may be driven according to an executable script stored and running on the host 101. The script or scripts may also provide for carrying out a plurality of disk functions including, for example, reading, writing, seeking, track following and the like while injecting and detecting a wide variety of errors. More specifically, software running on the host 101 may be configured so as to automatically set up and monitor the parameters of the tests to be conducted. For example, the software on the host 101 may load the FPGAs on the solid-state disk 102 and/or the controller 105, set the desired clock frequencies on the solid-state disk 102 and the controller 105, be configured to selectively upload and download the contents of the memories on the solid-state disk 102 and the controller 105, the setting and reading of hardware registers on the solid-state disk 102 and the controller 105 (to enable the changing of the timing boundaries of timing windows for the Sgate, Rgate and/or Rgate signals, for example) and to enable a hard reset of the solid-state disk 102 and the controller 105, among other exemplary functions. The software running on the host 101 may further enable test automation through a script interpreter capable of, for example, nested automation of script files, nested loops, running a single script file an unlimited number of times, loop on error, loop forever and/or stop on error functions, for example.

It is necessary to maintain both sector data tracks (such as shown at 406) and error data tracks (such as shown at 408) in the solid-state disk 102 because the variable length Error Correction Code (ECC) is unknown until the data is passed through the ECC error correction engine 416 of the controller 105. Changes cannot be made to the sector data 406 in the host 101 prior to loading the sector data since any change would impact the ECC. Therefore, the loadable error data stored in the error data memory 404 is used to induce errors in the sector data stored in the sector data memory 402 when reading back the adjacent error tracks 408. The solid-state disk 102 may also include a zone register 412 and a clock generator 414. The zone register 412 provides clock frequency data to the clock generator 414 to produce a data transfer rate appropriate for the zone of the disk being error tested. This enables tracks in any zone to be changed at will to test the controller's correction engine 416 on various regions of the disk as if the solid-state disk 102 were real, physical spinning media. The clock generator 414 may be programmable and may advantageously provide two independently programmable clocks. For example, the clock generator may provide clock signals from 390 KHz to 120 Mhz, although a wider range of clock frequencies may be readily implemented within the context of the present invention.

Figure 5:
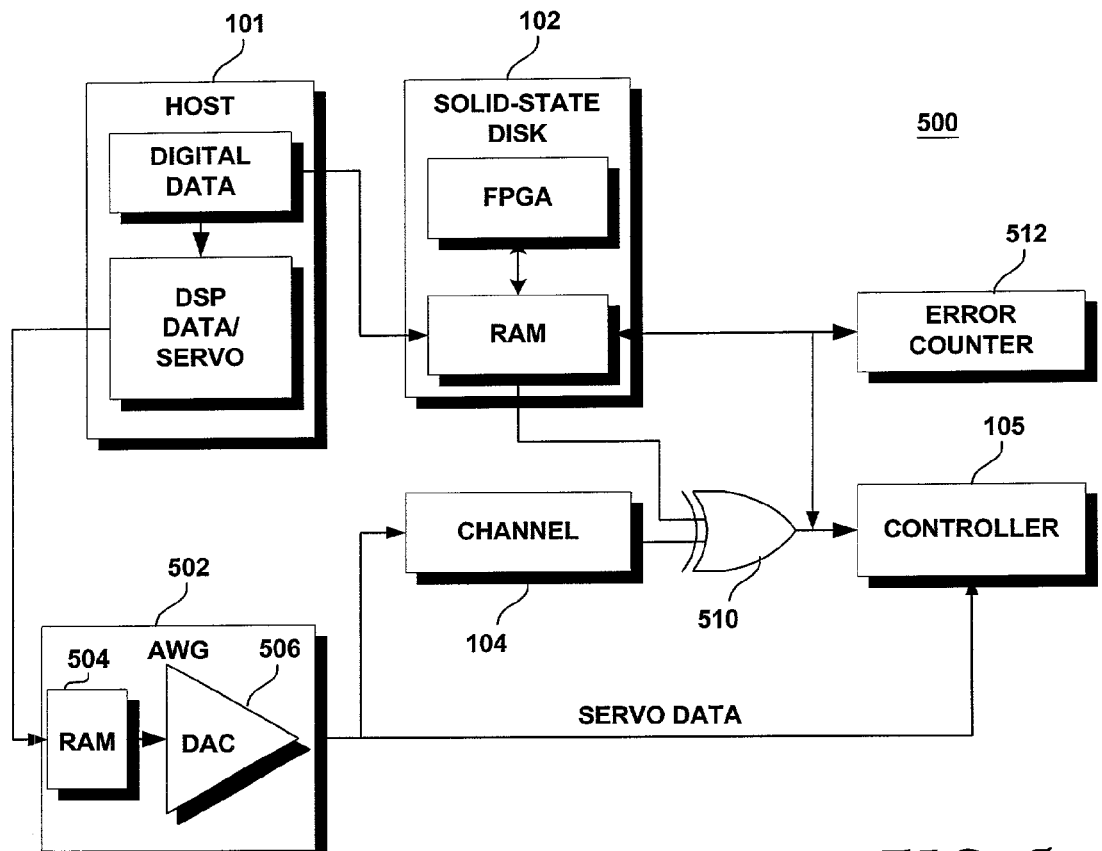
FIG. 5 is a diagram of channel error detection mechanism, according to an embodiment of the present invention.

In addition to supporting controller error detection and correction, the present invention supports real time testing of the channel 104. FIG. 5 is a diagram of such a channel error detection mechanism, according to an embodiment of the present invention. As shown therein, the channel error detection mechanism 500 includes the host 101, the solid-state disk 102, the controller 105, the channel 104, an error counter 512, an XOR logic gate 510 and an Arbitrary Waveform Generator (hereafter, "AWG") 502. Digital data (such as digital servo data, for example) is generated within the host 101 and passed to a Digital Signal Processing ("DSP") program (such as MatLab®, for example) running within the host 101, which sends the data to the AWG 502. The digital data sent to the DSP is also sent to the solid-state disk 102 and stored in memory therein (such as data memory 108, for example). The digital data from the host 101 is stored in RAM 504 and converted into analog form by DAC 506. The analog output of DAC 506 is then decoded by the channel 104 to attempt to recover the digital data output from the DSP within the host 101. The decoded output of the channel 104 is compared to the digital data stored within the memory of the solid-state disk 102. The NRZ output of the XOR gate 510 may be sent to the memory within the solid-state disk 102, to an error counter 512 and to the HIDC controller 105. The output of the AWG 502 (which may be characterized as servo data) is also sent to the controller 105. As long as the demodulated output of the channel 104 is identical to the digital data stored in the memory of the solid-state disk 102, the output of the XOR gate 510 will not be asserted. If, however, the output of the channel 104 differs from the value stored in the memory of the solid-state disk, the output of the XOR gate 510 is asserted, the error counter 512 incremented and the error stored in the memory of the solid-state disk 102. Unlike the error injection mechanism detailed relative to FIG. 4, the channel error detection scheme detailed above and shown in FIG. 5 uses two identical (unless the channel 104 generates error) data streams that are compared via the logical XOR gate 510.

If a problem can be simulated, its potential solutions may be implemented by changing the parameters of the models and/or by changing the models themselves. Once a solution is implemented in the model, its physical counterpart implementation should be apparent in the real world. This process of simulating a problem and solving the problem using an accurate model of the physical system allows designers to implement and validate a designed change must faster and in a less costly manner than turning silicon. Using such models, in turn, allows the drive's firmware to be developed at an early stage, and the design frozen onto the physical platform much sooner than would otherwise be possible. This is believed to significantly reduce the time to market of the resultant drive.

The present invention may be used as described above, to emulate the operation of a drive in which the read/write head is always on track. Such may be desirable if the testing and validation being carried out is to be limited to, for example, testing the ECC error correction engine 416 or selected portions of the operation of the firmware 114. This may allow time scaling the emulation to run much faster than a real disk drive is capable. However, the present invention also provides a complete electromechanical model of the head assembly, in order to fully test and validate the design.

FIG. 3 is a diagram of an electromechanical model 302 of a head actuator assembly coupled to the present solid-state disk and an emulation of the disk controller 105, according to an embodiment of the present invention. FIG. 3 includes a simplified diagram of the HIDC controller 105, as well as the solid-state disk 102, to illustrate the data paths and interactions thereof with the electromechanical model 302. As shown, the electromechanical model 302 may include (at least) an actuator model 330 and a spindle model 332. As shown, the actuator model 330 may include a Voice Coil Motor (hereafter, "VCM") and Head Stack Assembly (hereafter, "HSA") model 306, a head position to burst data translator 308, as well as a number of look up tables 310, 312, 314 (and/or optionally others, not shown) that model different mechanical and/or electrical characteristics of the HSA of the modeled drive. The spindle model 332 may include a spindle motor model 316 and a look up table 317 stores spindle motor characteristics that may be applied to the spindle motor model 316. Examples of such spindle motor characteristics include the torque and friction characteristics of the spindle motor. The look up tables 310, 312, 314, 316, 317 (and/or optionally others) may be changed at will to vary the simulated behavior of the HSA and/or of the spindle motor. The same structure of model and look up tables may be implemented to selectably and variably model any other mechanical or electromechanical system of the simulated drive, the present invention not being limited to the models and look up tables shown in the figures. The spindle motor model 316 is controlled by the HIDC controller 105 in the same manner as a real spindle motor would be. Indeed, the spindle motor model 316 may send the HIDC controller 105 a signal resembling a square wave that is representative of the back EMF pulses that would be generated by a real spindle motor. For the controller's firmware's point of view, there is preferably no difference between controlling the real spindle motor and controlling the model 316 thereof. In other words, the controller firmware need not be modified to control the spindle motor model 316.

According to the present invention, the digital serial command data 318 generated by the controller 105 (through the servo and controller firmware) is input to the VCM and Head model 306 of the electromechanical model 302. The VCM and HSA model 306 takes signal 318 and processes it and causes the emulated HSA to behave in the same manner and timing (or similar manner and timing, depending upon the accuracy of the simulation models) as would a physical head stack assembly. The electromechanical model 302 then outputs burst data at 320, which burst data represents the position of the read/write head over the emulated disk, integrated over time. For example, the burst data output from the head position to burst data translator 308 may represent the next position of the simulated head over the simulated disk (when simulating the track following disk function) or the track ID (when simulating the seek disk function). The electromechanical model 302, together with the solid-state disk 102 and the HIDC controller model 105 and associated hardware and software allow the same firmware 114 to be used in the present emulation as would be used in a real, physical drive. Firmware 114, therefore, is a full firmware set, which enables the disk to be designed, validated and tested with the same (or only slightly modified) firmware that will ultimately control the resultant physical drive.

The electromechanical model 302 may, according to an embodiment of the present invention, be implemented as a Field Programmable Gate Array (hereafter, "FPGA") such as manufactured, for example by Xilinx, Inc. of San Jose, Calif. For example, the Xilinx XVC series of FPGAs may be employed for both the electromechanical model 302 and to model the solid-state disk 102. FPGAs are Static Random Access Memory ("SRAM") loadable, which means that the characteristics of the electromechanical model 302 may be changed at will. The model 302 is based upon mathematical simulation models 322 that may be developed using mathematical simulation software packages such as, for example, MathCAD® or MatLab®. After a translation and compile steps shown at 324, Verilog code (or some other Hardware Description Language ("HDL") code) is generated at 326, which may then be used to program the FPGA, as shown at 328. Any of a number of utilities known to those of skill in this art may be employed to convert the behavioral models 322 developed using the mathematical simulation software package to HDL code. In the same manner, Verilog code may be developed that models the behavior of the HIDC controller model 105 and provide a disk controller design base for defining the constituent integrated circuit elements of the disk controller model 105.

The VCM and HSA model 306 may include time integration models based on differential calculus. The VCM & HSA model 306 may be advantageously embodied, for example, as a Finite Impulse Response (hereafter, "FIR") filter with tap weights to vary the characteristics of the FIR filter. The tap weights, according to an embodiment of the present invention, may be stored in tables 310, 312, 314 (and/or others). In this manner, the VCM & HSA model 306 may be configured to generate the desired waveform and the tables 310, 312, 314 (and/or others) may be utilized to store table look up values that selectively modify the generated waveform. For example, the table 310 may store values related to a selected HSA static or dynamic characteristic such as values associated with the torque exerted on the HSA by the flex cable that, in a real drive, carries the signals from the HSA to the printed circuit board containing the HIDC controller 105. Another table 312 may store values related to the resonance values of the HSA and table 314 may store values related to the torque experienced by the VCM of the actuator assembly, as the coil of the VCM moves into and out of the magnetic fields of the permanent magnets of the drive's top and bottom VCM plates. Other characteristics of the HSA may be stored in additional tables, each of which may act as tap weights to the FIR filter of the VCM and HSA model 306. The accuracy of the simulation (and/or of the resultant hardware) may be determined by, for example, creating Bode (for example) plots of the simulation and creating corresponding Bode plots for the hardware incarnation of the drive under development or test. By correlating the Bode plot(s) generated from the simulation from the Bode plot(s) generated from the real hardware drive, the differences between the real and simulated drives may be fully characterized. A programmable external clock 304 is provided provides a programmable timing reference, which allows the system to be time scaled, if desired.

Advantageously, the pre-silicon validation method according to the present invention includes hardware-accelerated emulation. The hardware-accelerated emulation is made possible by constructing the solid-state disk 102 and the electromechanical model 302 using FPGAs and SDRAMs, which enables the firmware to be run orders of magnitude faster than conventional Verilog® (or other hardware description language)-based simulations.

Figure 6:
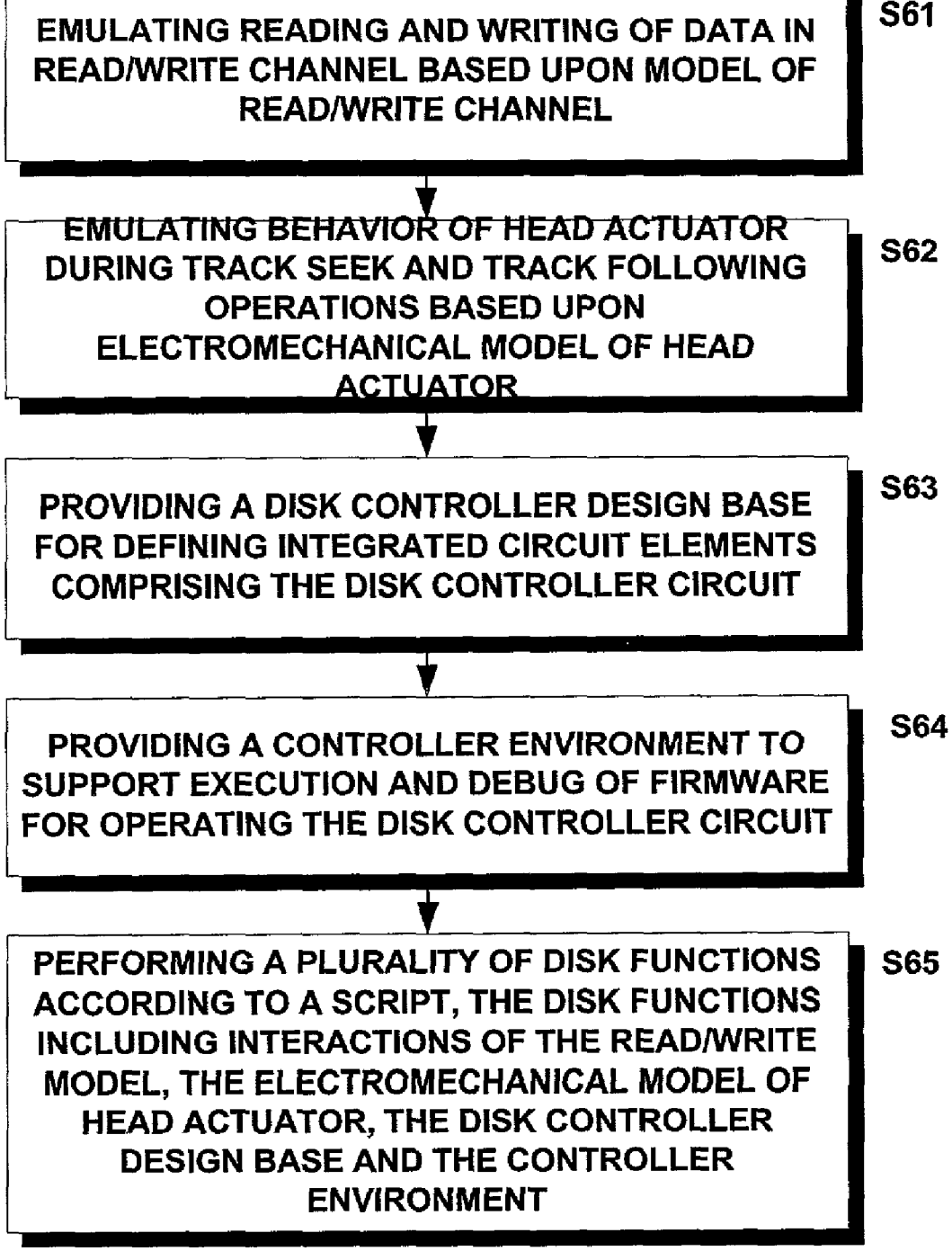
FIG. 6 is a flowchart of a method for verifying the design of a disk controller circuit to be incorporated into a targeted disk drive, according to an embodiment of the present invention.

FIG. 6 is a flowchart of a method for verifying the design of a disk controller circuit to be incorporated into a targeted disk drive, according to an embodiment of the present invention. The targeted disk drive includes a read/write channel and a head actuator. As shown in FIG. 6, the present invention, according to an embodiment thereof, step S61 calls for emulating reading and writing of data in the read/write channel of a disk drive based upon a model 104 of the read/write channel. Step S62 calls for emulating the behavior of the head actuator during track seek and track following operations based upon an electromechanical model 302 of the head actuator. Next in step S63, a disk controller design base is provided for defining integrated circuit elements comprising the disk controller circuit and a controller environment is provided, at S64, to support execution and debug of firmware 114 for operating the disk controller circuit. Thereafter, as shown at S65, a selected disk function or functions may be performed according to a script. The disk functions (e.g., read, write, seek, track following) may include interaction of the read/write channel model, the electromechanical model, the disk controller design base and the controller environment.

What is claimed is:

1. A method for verifying the design of a disk controller circuit to be incorporated into a targeted hard disk drive system, wherein the targeted hard disk drive system comprises a read/write channel and a head actuator, the method comprising the steps of:
    emulating reading and writing of data in the read/write channel based upon a model of the read/write channel;
    emulating a behavior of the head actuator during track seek and track following operations based upon an electromechanical model of the head actuator;
    providing a disk controller design base for defining integrated circuit elements comprising the disk controller circuit;
    providing a controller environment to support execution and debug of firmware for operating the disk controller circuit;
    performing a plurality of disk functions according to a script, wherein performance of at least one of the plurality of disk functions comprises the execution of the firmware, and wherein the plurality of disk functions comprise interaction of the read/write channel model, the electromechanical model, the disk controller design base and the controller environment.

2. The method of claim 1, wherein the plurality of disk functions are performed at a time-scaled rate, wherein the time-scaled rate maintains an accurate relative time relationship between the plurality of disk functions performed under direction of the script, and a real-time performance of the disk functions.

3. The method of claim 1, wherein the plurality of disk functions are performed at a plurality of environmental limits, wherein the models and the design base are made to operate according to their predicted behavior at the environmental limits.

* * * * *